United States Patent
Zhai

(10) Patent No.: US 11,973,029 B2
(45) Date of Patent: Apr. 30, 2024

(54) DEVICES AND METHODS OF VERTICAL INTEGRATIONS OF SEMICONDUCTOR CHIPS, MAGNETIC CHIPS, AND LEAD FRAMES

(71) Applicant: SUZHOU QING XIN FANG ELECTRONICS TECHNOLOGY CO., LTD., Suzhou (CN)

(72) Inventor: Jerry Zhijun Zhai, Toronto (CA)

(73) Assignee: SUZHOU QING XIN FANG ELECTRONICS TECHNOLOGY CO., LTD., Suzhou (CN)

( * ) Notice: Subject to any disclaimer, the term of this patent is extended or adjusted under 35 U.S.C. 154(b) by 234 days.

(21) Appl. No.: 17/667,734

(22) Filed: Feb. 9, 2022

(65) Prior Publication Data
US 2022/0157715 A1    May 19, 2022

Related U.S. Application Data

(62) Division of application No. 16/738,412, filed on Jan. 9, 2020, now Pat. No. 11,315,873.

(60) Provisional application No. 62/790,590, filed on Jan. 10, 2019.

(51) Int. Cl.
| | |
|---|---|
| *H01L 23/522* | (2006.01) |
| *H01L 21/56* | (2006.01) |
| *H01L 23/00* | (2006.01) |
| *H01L 23/498* | (2006.01) |

(52) U.S. Cl.
CPC .......... *H01L 23/5227* (2013.01); *H01L 21/56* (2013.01); *H01L 23/49827* (2013.01); *H01L 23/49861* (2013.01); *H01L 24/05* (2013.01); *H01L 24/13* (2013.01); *H01L 24/81* (2013.01)

(58) Field of Classification Search
CPC .......... H01L 23/5227; H01L 23/49827; H01L 23/49861
See application file for complete search history.

(56) References Cited

U.S. PATENT DOCUMENTS

| | | | |
|---|---|---|---|
| 9,871,004 B2 | 1/2018 | Zhai | |
| 2004/0245637 A1* | 12/2004 | Horak | H01L 24/05 257/758 |
| 2008/0186008 A1 | 8/2008 | Hirohashi et al. | |
| 2014/0145812 A1 | 5/2014 | Lee et al. | |
| 2018/0033773 A1* | 2/2018 | Huang | H01L 25/0657 |
| 2020/0152371 A1 | 5/2020 | Zhai | |
| 2020/0402709 A1 | 12/2020 | Zhai | |

* cited by examiner

*Primary Examiner* — Dale E Page
*Assistant Examiner* — Wilner Jean Baptiste
(74) *Attorney, Agent, or Firm* — Bayramoglu Law Offices LLC

(57) ABSTRACT

Techniques for providing vertical integrations of semiconductor chips, magnetic chips, and lead frames. The techniques can include fabricating an integrated circuit (IC) device as a multi-layer IC structure that includes, within a sealed protective enclosure, a first layer including at least one magnetic chip, a second layer including at least one semiconductor chip or die, and a lead frame. The techniques can further include vertically bonding the magnetic chip in the first layer onto the topside of the lead frame, and vertically bonding the semiconductor chip or die in the second layer on top of the magnetic chip to form a multi-layer IC structure.

6 Claims, 7 Drawing Sheets

Fig. 1 – Prior art

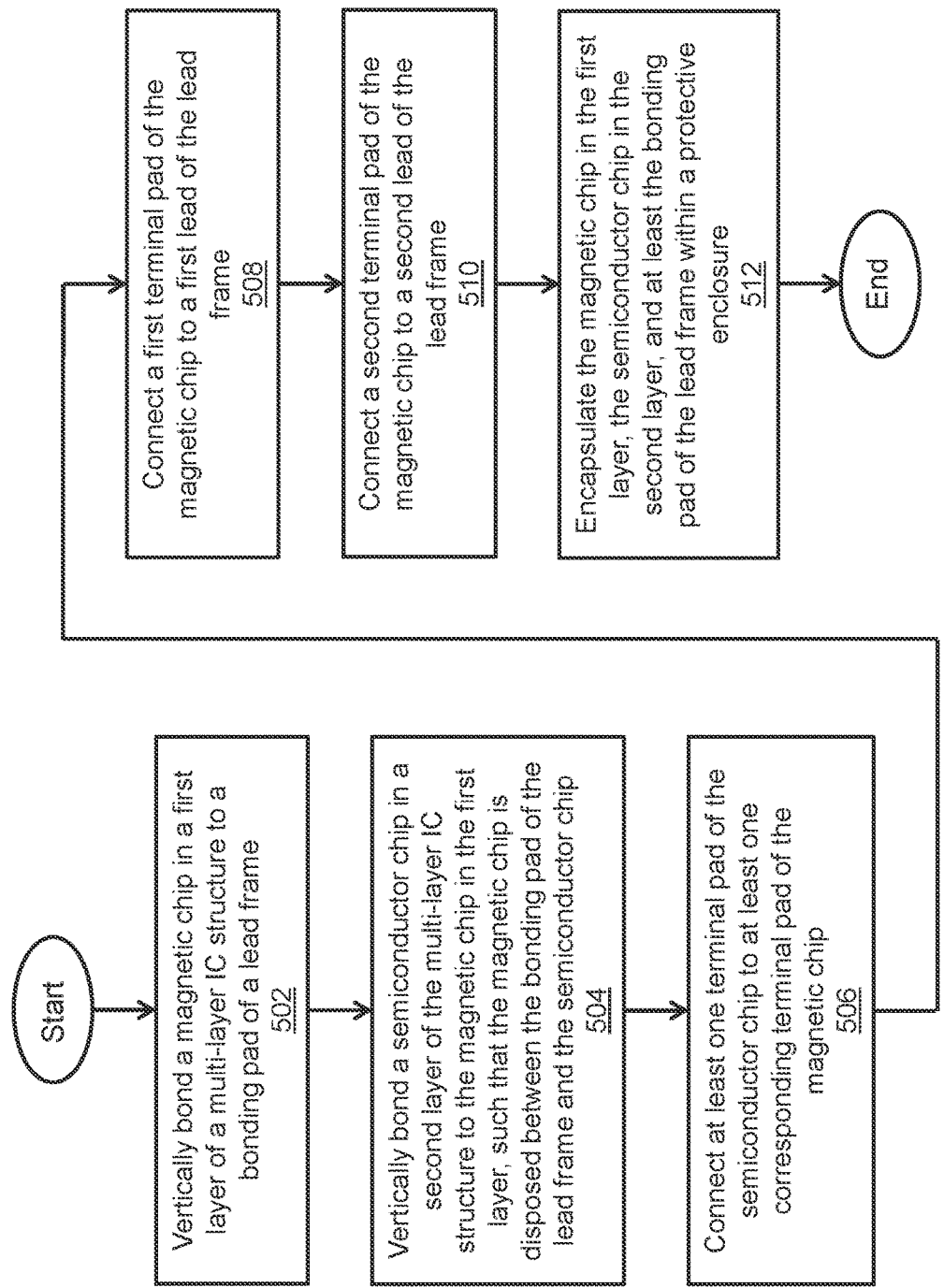

DEVICES AND METHODS OF VERTICAL INTEGRATIONS OF SEMICONDUCTOR CHIPS, MAGNETIC CHIPS, AND LEAD FRAMES

CROSS REFERENCE TO RELATED APPLICATIONS

This application is a divisional of U.S. patent application Ser. No. 16/738,412 filed Jan. 9, 2020 entitled DEVICES AND METHODS OF VERTICAL INTEGRATIONS OF SEMICONDUCTOR CHIPS, MAGNETIC CHIPS, AND LEAD FRAMES, which claims benefit of the priority of U.S. Provisional Patent Application No. 62/790,590 filed Jan. 10, 2019 entitled DEVICES AND METHODS OF VERTICAL INTEGRATIONS OF SEMICONDUCTOR CHIPS, MAGNETIC CHIPS, AND LEAD FRAMES.

BACKGROUND

Integrated circuit (IC) devices generally include one or more semiconductor chips (or dies) bonded to a lead frame and sealed within a protective enclosure. The semiconductor chips are typically bonded onto the topside of the lead frame, and terminal pads of the semiconductor chips are connected by bond wires to pins or leads provided at the periphery of the lead frame. The lead frame is typically made using a metal etching or stamping process, and is configured as a mechanical carrier for the semiconductor chips bonded thereon. In the case where the IC devices are mounted on a printed circuit (PC) board, the leads and bond wires are configured to connect the terminal pads of the semiconductor chips to conductive pads, traces, and/or runs of the PC board.

SUMMARY

Integrated circuit (IC) devices have drawbacks in that they are generally not configured to provide electromagnetic filtering functionality, electromagnetic transmitting functionality, or any other such electromagnetic functionality. Rather, the IC devices are typically mounted on a printed circuit (PC) board along with discrete inductors, transformers, and/or other discrete magnetics, which provide electromagnetic functionality separate from the IC devices. However, such configurations of IC devices and discrete magnetics can consume a large area of a PC board. Further, parasitic inductance or other parasitic effects of the discrete magnetics can impact semiconductor chip performance and potentially cause semiconductor chip failure, particularly at high frequencies.

Techniques are disclosed herein for providing vertical integrations of semiconductor chips, magnetic chips, and lead frames. The disclosed techniques can include fabricating an IC device as a multi-layer structure that has a first layer including at least one magnetic material chip (also referred to herein as a "magnetic chip"), a second layer including at least one semiconductor chip (or die), and a lead frame. The disclosed techniques can further include vertically bonding the magnetic chip in the first layer onto the topside of the lead frame, vertically bonding the semiconductor chip in the second layer on top of the magnetic chip, and sealing the multi-layer structure within a protective enclosure. By eliminating discrete magnetics, the IC device can be fabricated to allow a high degree of integration, significantly reducing the area consumed on a PC board. Further, because the magnetic chip is in close proximity to the semiconductor chip within the IC device, radio frequency (RF) and switching power management can be improved, reducing electromagnetic interference (EMI) irradiation and improving signal integrity. In addition, the multi-layer structure can provide improved thermal balance across the IC device while avoiding local thermal spots, increasing the reliability of the IC device.

In certain embodiments, a method of fabricating an integrated circuit (IC) device includes vertically bonding a magnetic chip in a first layer of the IC device to a bonding pad of a lead frame, and vertically bonding at least one semiconductor chip in a second layer of the IC device to the magnetic chip in the first layer, thereby forming a multi-layer IC structure. The magnetic chip in the first layer is disposed between the bonding pad of the lead frame and the semiconductor chip in the second layer. The method further includes connecting at least one terminal pad of the semiconductor chip in the second layer to at least one terminal pad of the magnetic chip in the first layer, respectively, connecting at least one terminal pad of the magnetic chip in the first layer to at least one lead of the lead frame, respectively, and encapsulating the multi-layer IC structure and the bonding pad of the lead frame within a protective enclosure.

In certain arrangements, the magnetic chip includes a plurality of terminal pads, and the method further includes forming a plurality of terminal bumps on a surface of the semiconductor chip facing the magnetic chip, and soldering the plurality of terminal bumps to at least some of the plurality of terminal pads, respectively, of the magnetic chip.

In certain arrangements, the magnetic chip includes organic material, one or more copper conductor layers, and one or more magnetic material layers, and the method further includes performing one or more of bonding and laminating the organic material of the magnetic chip with the copper conductor layers and the magnetic material layers.

In certain arrangements, the method further includes configuring the magnetic chip in the first layer as one or more of a single inductor, multiple inductors, coupled inductors with multiple coil windings, and a transformer having a primary winding and a secondary winding.

In certain arrangements, the method further includes disposing epoxy-based resin paste onto the bonding pad of the lead frame, placing the magnetic chip on the epoxy-based resin paste, and curing the epoxy-based resin paste according to a predetermined temperature profile to bond the magnetic chip to the bonding pad.

In certain arrangements, the method further includes shaping a bonding resin film to fit an area of the bonding pad of the lead frame, placing the bonding resin film on the bonding pad, placing the magnetic chip on the bonding resin film, and curing the bonding resin film according to a predetermined temperature profile to bond the magnetic chip to the bonding pad.

In certain arrangements, the semiconductor chip in the second layer includes a first semiconductor chip and a second semiconductor chip, in which each of the first semiconductor chip and the second semiconductor chip in the second layer has a surface facing away from the magnetic chip in the first layer. The method further includes connecting a terminal pad on the surface of the first semiconductor chip facing away from the magnetic chip to a first terminal pad of the magnetic chip, and connecting a terminal pad on the surface of the second semiconductor chip facing away from the magnetic chip to a second terminal pad of the magnetic chip.

In certain embodiments, an integrated circuit (IC) device includes a multi-layer IC structure having at least a first layer and a second layer, and a lead frame including a bonding pad. The first layer includes a magnetic chip, and the second layer includes at least one semiconductor chip. The magnetic chip in the first layer is vertically bonded to the bonding pad of the lead frame, and the semiconductor chip in the second layer is vertically bonded to the magnetic chip in the first layer. The magnetic chip in the first layer is disposed between the bonding pad of the lead frame and the semiconductor chip in the second layer. At least one terminal pad of the semiconductor chip in the second layer is connected to at least one terminal pad of the magnetic chip in the first layer, respectively. At least one terminal pad of the magnetic chip in the first layer is connected to at least one lead of the lead frame, respectively. The multi-layer IC structure and the bonding pad of the lead frame are encapsulated within a protective enclosure.

In certain arrangements, the magnetic chip includes organic material, one or more copper conductor layers, and one or more magnetic material layers.

In certain arrangements, the organic material includes one or more of epoxy, polyimide, epoxy mixed with polyimide, and liquid crystal polymer.

In certain arrangements, the magnetic material layers include one or more of a magnetic metal alloy and a sintered ferrite material.

In certain arrangements, the magnetic material layers include one or more magnetic composite materials.

In certain arrangements, the magnetic composite materials include one or more of Fe, FeNi, FeSiAl, FeSiAlCr, Co, MnZn, NiZn, and NiZnCu.

In certain arrangements, the protective enclosure is made of a molding compound.

In certain embodiments, a magnetic chip structure includes a semiconductor chip, a lead frame, and a magnetic chip. The magnetic chip is disposed in a vertical direction between the semiconductor chip and the lead frame.

In certain arrangements, the magnetic chip structure further includes at least a first coil winding and a second coil winding. The magnetic chip includes a first magnetic layer, a second magnetic layer, and at least one magnetic via configured to interconnect the first magnetic layer and the second magnetic layer. The first coil winding and the second coil winding are disposed in the vertical direction between the first magnetic layer and the second magnetic layer.

In certain arrangements, the first magnetic layer is disposed in the vertical direction between the semiconductor chip and the first coil winding. The first magnetic layer includes one or more patterned areas configured to allow one or more metal vias to pass therethrough between the semiconductor chip and the first coil winding. The second magnetic layer is configured as a solid layer without patterning for attachment on the lead frame.

In certain arrangements, the patterned areas of the first magnetic layer are filled with epoxy.

Other functions and aspects of the claimed features of this disclosure will be evident from the Detailed Description that follows.

BRIEF DESCRIPTION OF THE DRAWINGS

The foregoing and other objects, features, and advantages will be apparent from the following description of particular embodiments of the disclosure, as illustrated in the accompanying drawings, in which like reference characters refer to the same parts throughout the different views.

FIGS. 4b and 4c illustrate coil winding structures included in the inductor chip of FIG. 4a; and FIG. 5 is a flow diagram of an exemplary method of fabricating a multi-layer IC device that includes a magnetic chip in a first layer, a semiconductor chip in a second layer, and a lead frame.

DETAILED DESCRIPTION

The disclosures of U.S. patent application Ser. No. 16/738,412 filed Jan. 9, 2020 entitled DEVICES AND METHODS OF VERTICAL INTEGRATIONS OF SEMICONDUCTOR CHIPS, MAGNETIC CHIPS, AND LEAD FRAMES and U.S. Provisional Patent Application No. 62/790,590 filed Jan. 10, 2019 entitled DEVICES AND METHODS OF VERTICAL INTEGRATIONS OF SEMICONDUCTOR CHIPS, MAGNETIC CHIPS, AND LEAD FRAMES are hereby incorporated herein by reference in their entirety.

Techniques are disclosed herein for providing vertical integrations of semiconductor chips, magnetic chips, and lead frames. The disclosed techniques can include fabricating an integrated circuit device as a multi-layer structure that includes, within a sealed protective enclosure, a first layer including at least one magnetic material chip (also referred to herein as a "magnetic chip"), a second layer including at least one semiconductor chip, and a lead frame. The disclosed techniques can further include vertically bonding the magnetic chip in the first layer onto the topside of the lead frame, and vertically bonding the semiconductor chip in the second layer on top of the magnetic chip.

Figure 1:
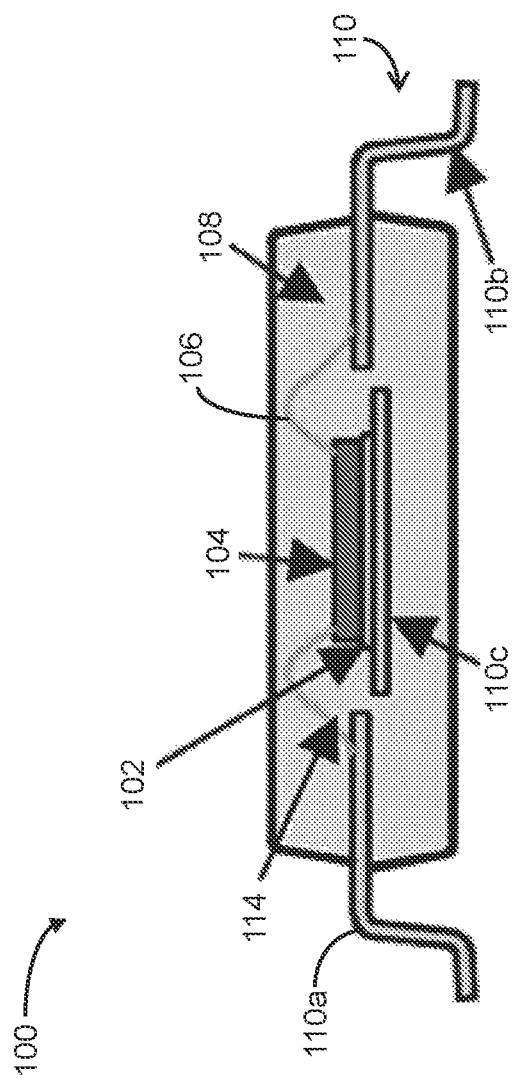
FIG. 1 illustrates a conventional integrated circuit (IC) device.

FIG. 1 depicts a cross-sectional view of a conventional integrated circuit (IC) device 100. As shown in FIG. 1, the conventional IC device 100 includes a semiconductor chip (or die) 104 and a lead frame 110 sealed within a protective enclosure 108. For example, the semiconductor chip 104 may be a silicon chip (or die) bonded to a bonding pad 110c of the lead frame 110 using conductive or non-conductive epoxy 102. The lead frame 110 includes at least a first lead 110a and a second lead 110b. A first bond wire 114 connects a first terminal pad of the semiconductor chip 104 to the first lead 110a, and a second bond wire 106 connects a second terminal pad of the semiconductor chip 104 to the second lead 110b. For example, the first and second leads 110a, 110b of the lead frame 110 may be soldered to conductive pads, traces, and/or runs of a printed circuit (PC) board (not shown).

The conventional IC device 100 of FIG. 1 has drawbacks in that it is not configured to provide electromagnetic filtering functionality, electromagnetic transmitting functionality, or any other such electromagnetic functionality. Rather, the conventional IC device 100 is configured to be mounted on a PC board along with discrete inductors, transformers, and/or other discrete magnetics, which provide electromagnetic functionality separate from the conventional IC device 100. However, such a configuration of the conventional IC device 100 and discrete magnetics can consume a large area of the PC board. Further, parasitic inductance or other parasitic effects of the discrete magnetics can impact the performance of the semiconductor chip 104 and potentially cause the semiconductor chip 104 to fail, particularly at high frequencies.

Figure 2:
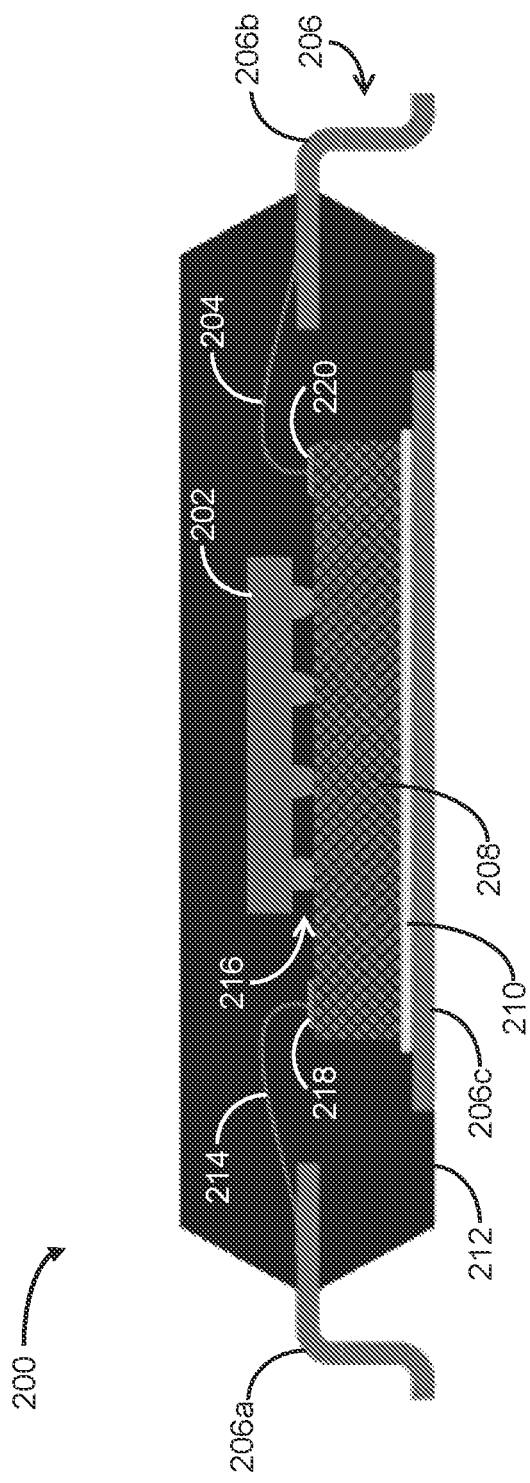
FIG. 2 illustrates a first exemplary IC device configured as a multi-layer structure, which includes, within a sealed protective enclosure, a first layer including a magnetic chip, a second layer including a semiconductor chip, and a lead frame.

FIG. 2 depicts an illustrative embodiment of a first exemplary IC device 200, which can include a semiconductor chip (or die) 202, a magnetic chip 208, and a lead frame 206. As shown in FIG. 2, the IC device 200 can be fabricated as a multi-layer structure that includes a first layer incorporating the magnetic chip 208, and a second layer incorporating the semiconductor chip 202. To fabricate the multi-layer structure of the IC device 200, the magnetic chip 208 in the first layer can be vertically bonded to a bonding pad 206c of the lead frame 206 using non-conductive, adhesive, epoxy-based resin paste 210, the semiconductor chip 202 in the second layer can be vertically bonded to the magnetic chip 208 using solder, and the first and second layers can be encapsulated within a protective enclosure 212 made of molding compound. Further, a first metal pad 218 (such as a first inductor terminal) of the magnetic chip 208 can be connected to a first lead 206a of the lead frame 206 by a first bond wire 214, and a second metal pad 220 (such as a second inductor terminal) of the magnetic chip 208 can be connected to a second lead 206b of the lead frame 206 by a second bond wire 204. Having fabricated the IC device 200, the first and second leads 206a, 206b of the lead frame 206 can be soldered to conductive pads, traces, and/or runs of a printed circuit (PC) board (not shown).

In one embodiment, a plurality of terminal bumps 216 can be formed on the surface of the semiconductor chip 202 facing the magnetic chip 208. For example, the plurality of terminal bumps 216 may each have a height ranging from about 15 μm to 300 μm, and may be made of gold (Au), solder balls, copper (Cu) pillars surface-coated with solder, or any other suitable material(s). Further, the semiconductor chip 202 may be vertically bonded to the magnetic chip 208 by soldering the plurality of terminal bumps 216 to respective pads or terminals (not shown) of the magnetic chip 208. While vertically bonding the semiconductor chip 202 to the magnetic chip 208, epoxy can be used to fill any gaps or voids between the opposing surfaces of the semiconductor chip 202 and the magnetic chip 208, enhancing the mechanical strength and reliability of the IC device 200.

In one embodiment, the magnetic chip 208 can be made of an organic material bonded and laminated with copper conductor layers and magnetic material layers, and can have a thickness ranging from about 150 μm to 1,900 μm. For example, the organic material may include one or more of epoxy, polyimide, epoxy mixed with polyimide, liquid crystal polymer, and/or any other suitable organic material(s). Following lamination and curing of the organic material, an adequate bonding strength and mechanical strength can be achieved. The magnetic material may be a magnetic metal alloy or sintered ferrite including Fe, FeNi, FeSiAl, FeSiAlCr, Co, MnZn, NiZn, NiZnCu, and/or any other suitable magnetic composite material(s).

Further, the magnetic chip 208 may be configured as a single inductor, multiple inductors coupled inductors with multiple coil windings, a transformer having a primary winding and a secondary winding, and/or any other suitable magnetics. The epoxy-based resin paste 210 can initially be disposed on the bonding pad 206c of the lead frame 206, and the magnetic chip 208 can be placed onto the epoxy-based resin paste 210, which can then be cured according to a predetermined temperature profile to bond the magnetic chip 208 to the bonding pad 206c. Alternatively, a bonding resin film shaped to fit the area of the bonding pad 206c can be employed instead of the epoxy-based resin paste 210 to bond the magnetic chip 208 to the bonding pad 206c.

The first metal pad 218 and the second metal pad 220 of the magnetic chip 208 can each have a circular shape or a rectangular (e.g., square) shape with a diameter or a diagonal dimension, respectively, ranging from about 80 μm to 500 μm. The first bond wire 214 and the second bond wire 204 may be made of gold (Au), copper (Cu), aluminum (Al), metal alloy, or any other suitable conductive material. The first and second metal pads 218, 220 can have ENIG metallization to be compatible with the conductive material used to make the first and second bond wires 204, 214.

The lead frame 206 can implemented using any suitable discrete transistor package type of lead frame, such as type TO including TO252, TO263, TO220, TO247, or TO240, and can have 3 to 256 leads or any other suitable number of leads. The lead frame 206 can alternatively be implemented using one of the following discrete transistor package types of lead frames: Small Outline Transistor (SOT), Small Outline Package (SOP), Shrink Small-Outline Package (SSOP), Thin Small Outline Package (TSSOP), Micro Small Outline Package (uSOP), Thin Very Small Outline Package (TVSOP), Mini Small Outline Package (MSOP), Plastic Small Outline Package (PSOP), Small Outline Package Integrated Circuit (SOIC), Dual Flat No-lead Package (DFN), Quad Flat No-lead Package (QFN), Power Flat No-lead Package (PQFN), Chip Scale Package (CSP), or any suitable modification or derivative thereof. The IC device 200 can have an overall thickness ranging from about 600 μm to 4.5 mm.

Figure 3:
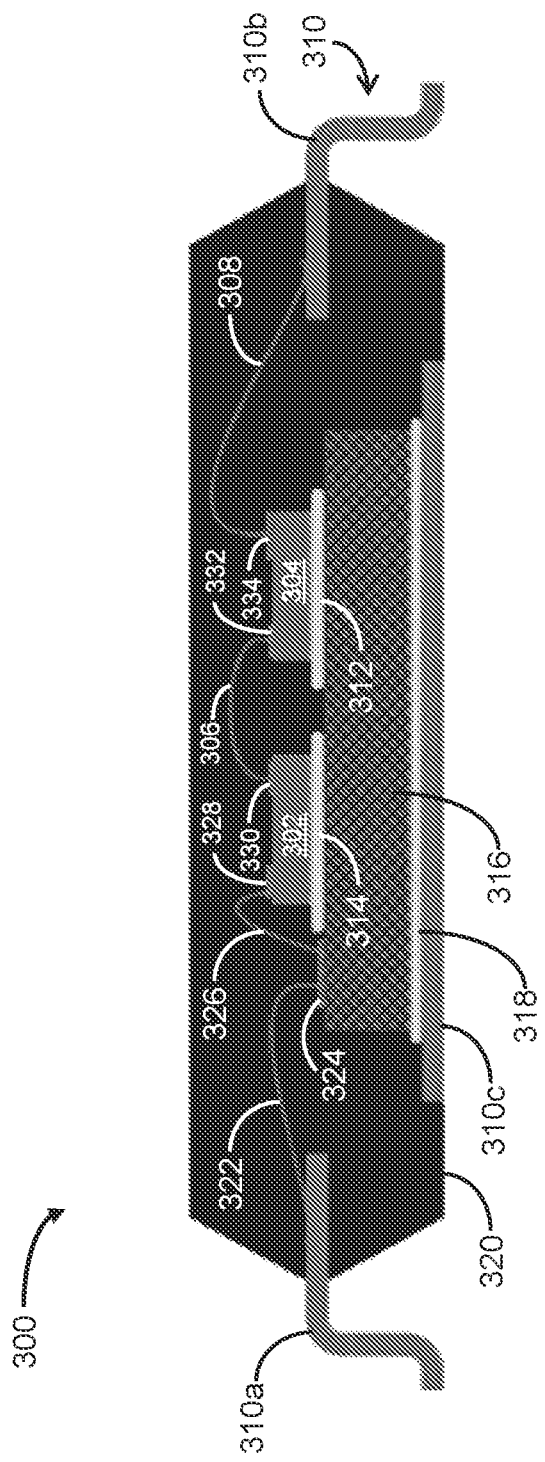
FIG. 3 illustrates a second exemplary IC device configured as a multi-layer structure, which includes, within a sealed protective enclosure, a first layer including a magnetic chip, a second layer including a plurality of semiconductor chips, and a lead frame.

FIG. 3 depicts an illustrative embodiment of a second exemplary IC device 300, which can include a plurality of semiconductor chips (or dies) 302, 304, a magnetic chip 316, and a lead frame 310. As shown in FIG. 3, the IC device 300 can be fabricated as a multi-layer structure that includes a first layer incorporating the magnetic chip 316, and a second layer incorporating the plurality of semiconductor chips 302, 304. To fabricate the multi-layer structure of the IC device 300, the magnetic chip 316 in the first layer can be vertically bonded to a bonding pad 310c of the lead frame 310 using non-conductive, adhesive, epoxy-based resin paste 318, the semiconductor chips 302, 304 can be vertically bonded to the magnetic chip 316 using non-conductive, adhesive, epoxy-based resin paste 314, 312, respectively, and the multi-layer structure can be encapsulated within a protective enclosure 320 made of molding compound. Further, a metal pad 324 (such as an inductor terminal) of the magnetic chip 316 can be connected to a first lead 310a of the lead frame 310 by a bond wire 322.

Unlike the semiconductor chip 202 of FIG. 2, each of the semiconductor chips 302, 304 of FIG. 3 can be bonded to the magnetic chip 316 so that its respective pads, terminals, or other contacts face away from the magnetic chip 316. For example, the semiconductor chip 302 may have a first terminal pad 328 and a second terminal pad 330 facing away from the magnetic chip 316, and the semiconductor chip 304 may have a first terminal pad 332 and a second terminal pad 334 facing away from the magnetic chip 316. Further, the first terminal pad 328 of the semiconductor chip 302 may be connected to the metal pad 324 of the magnetic chip 316 by a bond wire 326, the second terminal pad 330 of the semiconductor chip 302 may be connected to the first terminal pad 332 of the semiconductor chip 304 by a bond wire 306, and the second terminal pad 334 of the semiconductor chip 304 can be connected to a second lead 310*b* of the lead frame 310 by a bond wire 308. Having fabricated the IC device 300, the first and second leads 310*a*, 310*b* of the lead frame 310 can be soldered to conductive pads, traces, and/or runs of a printed circuit (PC) board (not shown).

Figure 4A:
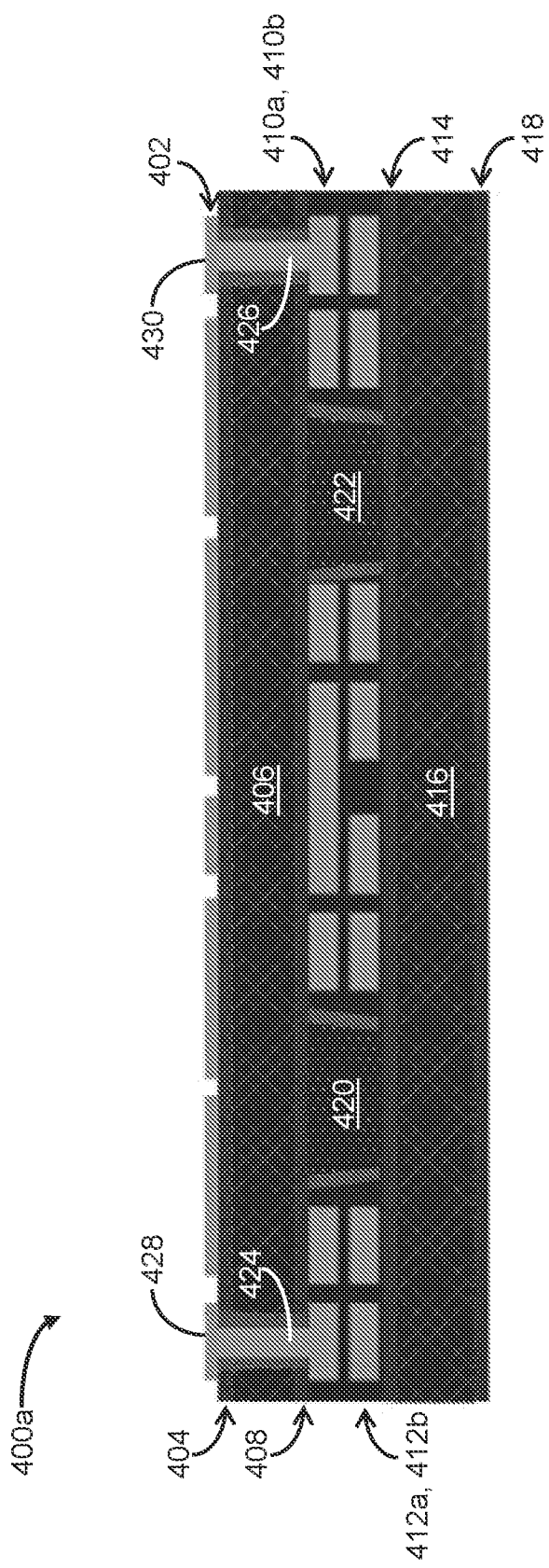
FIG. 4a illustrates an exemplary magnetic chip structure embodied as an inductor chip.
Figure 4B:
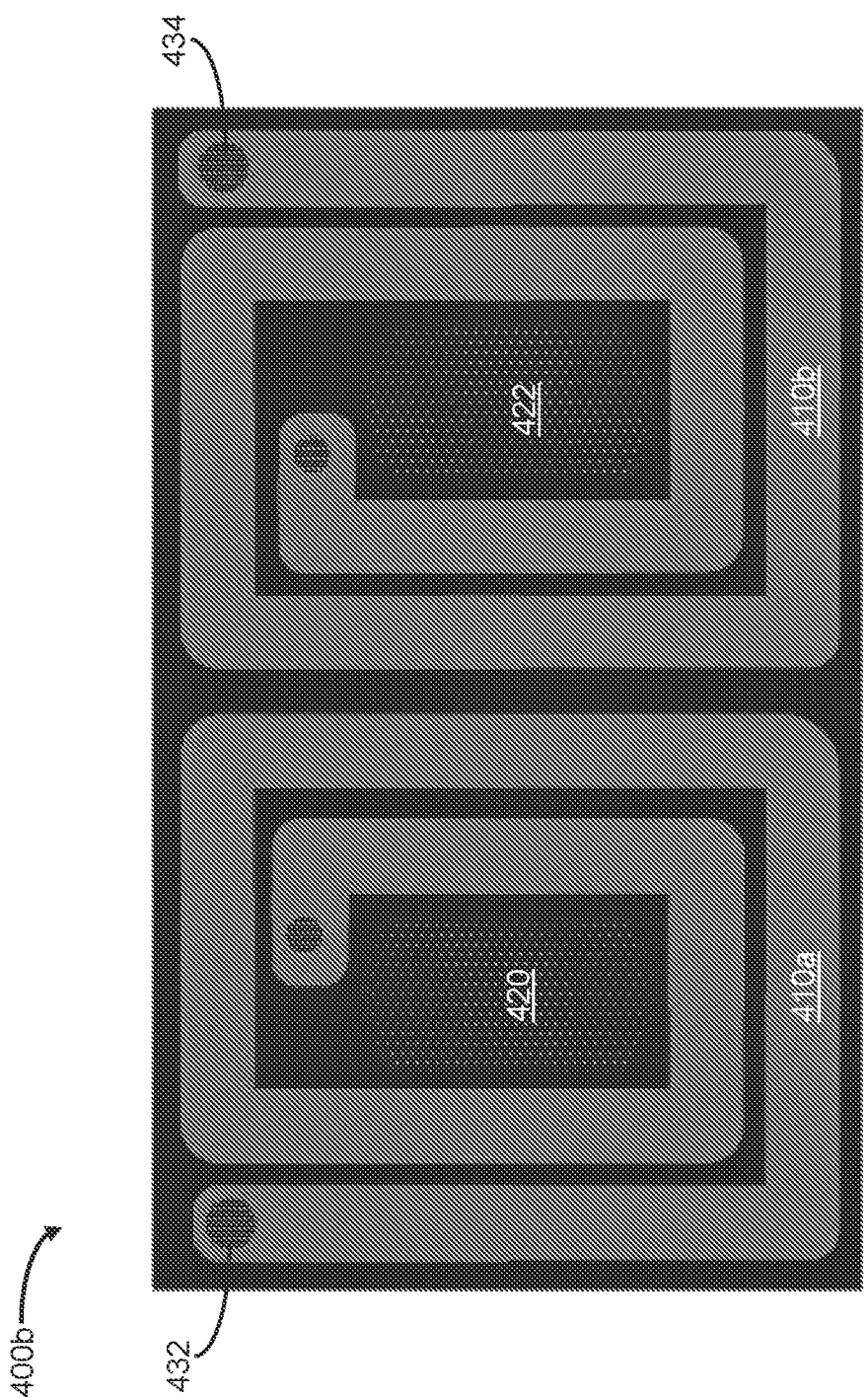
Figure 4C:
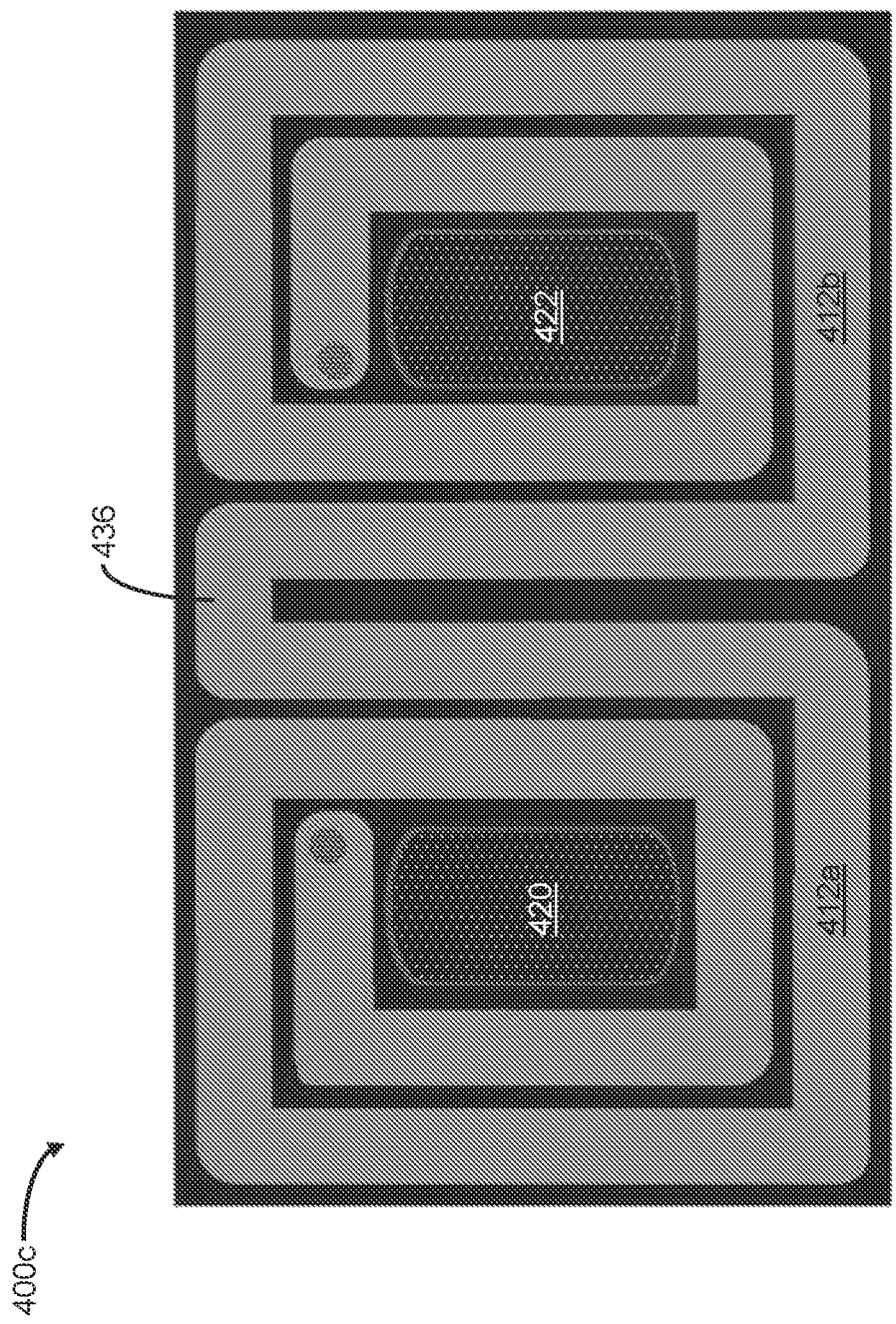

FIG. 4*a* depicts an exemplary magnetic chip structure embodied as an inductor chip 400*a*. The inductor chip 400*a* can be configured as a vertically laminated magnetic die having multiple functional layers bonded together. As shown in FIG. 4*a*, the inductor chip 400*a* can include a first metal layer 402, a first dielectric layer 404, a first magnetic layer 406, a second dielectric layer 408, at least two (2) conductive layers 410*a,b*, 412*a,b*, a third dielectric layer 414, a second magnetic layer 416, and a fourth dielectric layer 418. The conductive layers 410*a,b*, 412*a,b* can be plated and etched copper (Cu) films, and can be patterned to provide coil windings of the inductor chip 400*a*. The inductor chip 400*a* can further include a plurality of conductive magnetic vias 420, 422, which can be fabricated using magnetic powder filler mixed with organic binder powders (e.g., epoxy resin). The magnetic vias 420, 422 can be formed, plugged, or otherwise disposed substantially in the center of the respective coil windings of the conductive layers 410*a,b*, 412*a,b*, as shown in FIGS. 4*b* and 4*c*. The magnetic vias 420, 422 can be configured to increase the inductance density and lower the height of the inductor chip 400*a*, as well as reduce the area of the inductor chip 400*a* to allow it to be incorporated into a desired IC package housing. It is noted that the magnetic vias 420, 422 can be configured with epoxy dielectric walls (not numbered) to isolate them from the conductive layers 410*a,b*, 412*a,b*. It is further noted that the thickness of the inductor chip 400*a* can be in a range of about 400 um to 2000 um. The thickness of each functional layer of the inductor chip 400*a* can also be adjusted to accommodate a desired IC package housing.

The first metal layer 402 of the inductor chip 400*a* (see FIG. 4*a*) can be configured to function as an interconnection/re-distribution layer for interconnection with a semiconductor chip and/or bonding pads of a lead frame. The first metal layer 402 can be a patterned copper (Cu) base layer, which can be plated and etched with a finishing Nickel-Palladium-Gold (NiPdAu) metal composition to facilitate bonding of wires from the first metal layer 402 to pins/pads of the semiconductor chip and/or lead frame. As shown in FIG. 4*a*, the first metal layer 402 can include a plurality of pads 428, 430, which can be connected to the conductive layer 410*a*, 410*b* by a plurality of metal vias 424, 426, respectively. It is noted that the metal vias 424, 426 can be configured with epoxy dielectric walls (not numbered) to isolate them from the first magnetic layer 406, which can be patterned to allow the metal vias 424, 426 to pass therethrough. The second magnetic layer 416 can be configured as a solid layer without any patterning.

The first dielectric layer 404, the second dielectric layer 408, the third dielectric layer 414, and the fourth dielectric layer 418 can each be fabricated using epoxy film, PI film, or any other suitable organic dielectric film. The fourth dielectric layer 418 can be applied to the second magnetic layer 416 as passivation layer to protect the magnetic chip structure from excessive mechanical and/or thermal stresses during fabrication and/or electrical operation. The fourth dielectric layer 418 can be bonded to a lead frame during a packaging assembly process. The first and second magnetic layers 406, 416 can be fabricated using ferrite, Fe—Ni alloy, Fe—Si—Al alloy, Fe—Si—Al—Cr alloy, Mn—Zn alloy, Ni—Zn, Cobalt-Zn, or any other suitable sintered or metal alloy material.

FIGS. 4*b* and 4*c* depict coil winding structures 400*b*, 400*c*, respectively, of the inductor chip 400*a*. As shown in FIG. 4*b*, the coil winding structure 400*b* can be implemented in the conductive layer 410*a*, 410*b*, such that a first conductive layer portion (corresponding to reference numeral 410*a*) is patterned and wound around the magnetic via 420, and a second conductive layer portion (corresponding to reference numeral 410*b*) is patterned and wound around the magnetic via 422. As shown in FIG. 4*c*, the coil winding structure 400*c* can likewise be implemented in the conductive layer 412*a*, 412*b*, such that a first conductive layer portion (corresponding to reference numeral 412*a*) is patterned and wound around the magnetic via 420, and a second conductive layer portion (corresponding to reference numeral 412*b*) is patterned and wound around the magnetic via 422. The first and second conductive layer portions 412*a*, 412*b* can be interconnected by a metal trace 436. As shown in FIG. 4*b*, the first and second conductive layer portions 410*a*, 410*b* can include a first metal pad 432 and a second metal pad 434, respectively. The first metal pad 432 can be connected to the metal via 424 (see FIG. 4*a*), and the second metal pad 434 can be connected to the metal via 426 (see also FIG. 4*a*).

An exemplary method of fabricating a multi-layer IC device including a magnetic chip in a first layer, a semiconductor chip in a second layer, and a lead frame is described below with reference to FIG. 5. As depicted in block 502, the magnetic chip in the first layer is vertically bonded to a bonding pad of the lead frame. As depicted in block 504, the semiconductor chip in the second layer is vertically bonded to the magnetic chip, such that the magnetic chip is disposed between the bonding pad of the lead frame and the semiconductor chip. As depicted in block 506, at least one terminal pad of the semiconductor chip is connected to at least one corresponding terminal pad of the magnetic chip. As depicted in block 508, a first terminal pad of the magnetic chip is connected to a first lead of the lead frame. As depicted in block 510, a second terminal pad of the magnetic chip is connected to a second lead of the lead frame. As depicted in block 512, the magnetic chip in the first layer, the semiconductor chip in the second layer, and at least the bonding pad of the lead frame are encapsulated within a protective enclosure.

While various embodiments of the disclosure have been particularly shown and described, it will be understood by those skilled in the art that various changes in form and details may be made therein without departing from the scope of the disclosure, as defined by the appended claims.

What is claimed is:

1. A method of fabricating an integrated circuit (IC) device, comprising:
vertically bonding a magnetic chip in a first layer of the IC device to a bonding pad of a lead frame;
vertically bonding at least one semiconductor chip in a second layer of the IC device to the magnetic chip in the first layer to form a multi-layer IC structure, the magnetic chip in the first layer being disposed between the bonding pad of the lead frame and the at least one semiconductor chip in the second layer;
connecting at least one terminal pad of the at least one semiconductor chip in the second layer to at least one terminal pad of the magnetic chip in the first layer, respectively;

connecting at least one terminal pad of the magnetic chip in the first layer to at least one lead of the lead frame, respectively; and encapsulating the multi-layer IC structure and the bonding pad of the lead frame within a protective enclosure, wherein the magnetic chip includes organic material, one or more copper conductor layers, and one or more magnetic material layers, and wherein the method further comprises:

performing one or more of bonding and laminating the organic material of the magnetic chip with the one or more copper conductor layers and the one or more magnetic material layers.

2. The method of claim 1 wherein the magnetic chip includes a plurality of terminal pads, and wherein the method further comprises:

forming a plurality of terminal bumps on a surface of the at least one semiconductor chip facing the magnetic chip, and wherein the vertically bonding of the at least one semiconductor chip to the magnetic chip includes soldering the plurality of terminal bumps to at least some of the plurality of terminal pads, respectively, of the magnetic chip.

3. The method of claim 1 further comprising:

configuring the magnetic chip in the first layer as one or more of a single inductor, multiple inductors, coupled inductors with multiple coil windings, and a transformer having a primary winding and a secondary winding.

4. The method of claim 1 further comprising:

disposing epoxy-based resin paste onto the bonding pad of the lead frame;

placing the magnetic chip on the epoxy-based resin paste; and curing the epoxy-based resin paste according to a predetermined temperature profile to bond the magnetic chip to the bonding pad.

5. The method of claim 1 further comprising:

shaping a bonding resin film to fit an area of the bonding pad of the lead frame;

placing the magnetic chip on the bonding resin film; and curing the bonding resin film according to a predetermined temperature profile to bond the magnetic chip to the bonding pad.

6. The method of claim 1 wherein the at least one semiconductor chip in the second layer includes a first semiconductor chip and a second semiconductor chip, wherein each of the first semiconductor chip and the second semiconductor chip in the second layer has a surface facing away from the magnetic chip in the first layer, and wherein the connecting of the at least one terminal pad of the at least one semiconductor chip to the at least one terminal pad of the magnetic chip, respectively, includes (i) connecting a terminal pad on the surface of the first semiconductor chip facing away from the magnetic chip to a first terminal pad of the magnetic chip, and (ii) connecting a terminal pad on the surface of the second semiconductor chip facing away from the magnetic chip to a second terminal pad of the magnetic chip.

* * * * *